United States Patent
Liu et al.

(10) Patent No.: US 7,360,583 B2
(45) Date of Patent: *Apr. 22, 2008

(54) INTEGRATED LIQUID COOLING SYSTEM FOR ELECTRONIC COMPONENTS

(75) Inventors: Tay-Jian Liu, Guangdong (CN); Chih-Hao Yang, Guangdong (CN); Chao-Nien Tung, Guangdong (CN); Chuen-Shu Hou, Guangdong (CN)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 142 days.

This patent is subject to a terminal disclaimer.

(21) Appl. No.: 11/308,275

(22) Filed: Mar. 15, 2006

(65) Prior Publication Data

US 2007/0023167 A1    Feb. 1, 2007

(30) Foreign Application Priority Data

Jul. 29, 2005    (TW) .............................. 94125772 A

(51) Int. Cl.
*H05K 7/20*    (2006.01)
(52) U.S. Cl. ................................ 165/80.4; 165/104.33; 257/714; 361/699; 417/313
(58) Field of Classification Search .............. 165/80.4, 165/104.31, 104.33; 257/714; 361/699; 417/413.1, 416
See application file for complete search history.

(56) References Cited

U.S. PATENT DOCUMENTS

| | | | |
|---|---|---|---|
| 6,327,145 B1 * | 12/2001 | Lian et al. .................. | 165/80.4 |
| 6,408,937 B1 * | 6/2002 | Roy ........................ | 165/104.33 |
| 6,668,911 B2 * | 12/2003 | Bingler ...................... | 165/80.4 |
| 6,749,012 B2 * | 6/2004 | Gwin et al. ................. | 165/80.4 |
| 6,894,899 B2 * | 5/2005 | Wu et al. ................... | 361/699 |
| 6,988,537 B2 * | 1/2006 | Hata et al. ............. | 165/104.33 |
| 7,086,453 B2 | 8/2006 | Lee et al. | |
| 7,117,931 B2 * | 10/2006 | Crocker et al. ........ | 165/104.33 |
| 7,124,811 B2 * | 10/2006 | Crocker et al. ........ | 165/104.33 |
| 7,222,661 B2 * | 5/2007 | Wei et al. .................. | 165/80.4 |
| 2004/0105232 A1 * | 6/2004 | Ito et al. ..................... | 361/699 |
| 2005/0241809 A1 * | 11/2005 | Tomioka et al. ....... | 165/104.33 |
| 2005/0243518 A1 * | 11/2005 | Hata et al. .................. | 361/699 |
| 2006/0185829 A1 * | 8/2006 | Duan et al. ............ | 165/104.33 |
| 2006/0185830 A1 * | 8/2006 | Duan ..................... | 165/104.33 |
| 2006/0187640 A1 * | 8/2006 | Tomioka et al. ............ | 361/699 |
| 2007/0000648 A1 * | 1/2007 | Crocker et al. ........ | 165/104.33 |

(Continued)

FOREIGN PATENT DOCUMENTS

TW    M243830    9/2004

(Continued)

*Primary Examiner*—Leonard R Leo
(74) *Attorney, Agent, or Firm*—Winston Hsu

(57) ABSTRACT

An integrated liquid cooling system (100) includes a pump (10), a mounting base (15), a heat dissipating member (20). The mounting base defines therein a through hole (151). The heat dissipating member is mounted to and maintained in fluid communication with the mounting base. The pump is received in the through hole of the mounting base. The pump has a bottom plate for thermally contacting a heat generating component and is configured for driving a coolant to circulate through the mounting base and the heat dissipating member. The pump, the mounting base and the heat dissipating member of the liquid cooling system are combined together to form an integrated and compact structure without utilizing any connecting pipes or fittings.

11 Claims, 5 Drawing Sheets

U.S. PATENT DOCUMENTS

| | | | |
|---|---|---|---|
| 2007/0034353 A1* | 2/2007 | Liu et al. ................... | 165/80.4 |
| 2007/0034359 A1* | 2/2007 | Liu et al. ............... | 165/104.31 |
| 2007/0103869 A1* | 5/2007 | Liu et al. ................... | 361/699 |
| 2007/0110592 A1* | 5/2007 | Liu et al. ................... | 417/313 |

FOREIGN PATENT DOCUMENTS

| | | |
|---|---|---|
| TW | 094200892 | 1/2005 |

* cited by examiner

INTEGRATED LIQUID COOLING SYSTEM FOR ELECTRONIC COMPONENTS

CROSS-REFERENCES TO RELATED APPLICATION

Relevant subject matter is disclosed in two copending U.S. patent applications filed on the same date and each having a same title with the present application, which are assigned to the same assignee with this patent application.

1. FIELD OF THE INVENTION

The present invention relates generally to a cooling device, and more particularly to a liquid cooling system with an integrated structure. The liquid cooling system can be suitably applied for removing heat from heat generating electronic components.

2. DESCRIPTION OF RELATED ART

Along with fast developments in electronic information industries, electronic components such as central processing units (CPUs) of computers are made to be capable of operating at a much higher frequency and speed. As a result, the heat generated by the CPUs during their normal operations is commensurately increased. The generated heat, if not timely removed away from the CPUs, may cause them to become overheated and finally affect the workability and stability of the CPUs. In order to remove the heat of the CPUs and hence to maintain the CPUs to work normally, cooling devices must be provided to the CPUs to dissipate heat therefrom. Conventionally, extruded heat sinks combined with electric fans are frequently used for this heat dissipation purpose. However, these conventional cooling devices prove ineffective and unsatisfactory to cool down the current high speed CPUs.

In recent years, liquid cooling systems have been proposed to remove heat from the current high speed CPUs. As a more effective cooling device, the liquid cooling system generally includes a pump, a heat absorbing member and a heat dissipating member. In practice, these components are connected together in series by a plurality of pipes or fittings so as to form a heat transfer loop through which a coolant is circulated. The heat absorbing member is maintained in thermal contact with a heat generating component such as CPU for absorbing the heat generated by the heat generating component. The liquid cooling system employs the coolant circulating through the heat transfer loop so as to bring the heat of the heat generating component from the heat absorbing member to the heat dissipating member for dissipation. Under the drive of the pump, the coolant as cooled down in the heat dissipating member, is sent back to the heat absorbing member for being available again for heat absorption from the heat generating component.

The liquid cooling system still has the following drawbacks. Since the pump, the heat absorbing member and the heat dissipating member are connected together by a large number of pipes or fittings, it is difficult to make the resultant liquid cooling system to have a compact structure. The requirement of the large number of pipes or fittings also adds assembly complexity to the liquid cooling system and raises the chance of liquid leakage at the joints between the pipes or fittings and the components (i.e., the pump, the heat absorbing member and the heat dissipating member) of the liquid cooling system. In application, mounting of the liquid cooling system will be a tiresome and time-consuming work since the components of the liquid cooling system are required to be addressed individually. Similarly, if the liquid cooling system is desired to be demounted for purposes of repair or replacement, the components of the liquid cooling system are also required to be individually demounted.

Therefore, it is desirable to provide a liquid cooling system which overcomes the foregoing disadvantages.

SUMMARY OF INVENTION

The present invention relates to a liquid cooling system for removing heat from a heat generating component. The liquid cooling system includes a mounting base, a heat dissipating member and a pump. The mounting base defines therein a through hole. The heat dissipating member is mounted to and maintained in fluid communication with the mounting base. The pump is received in the through hole of the mounting base. The pump has a bottom plate for thermally contacting the heat generating component and is configured for driving a coolant to circulate through the mounting base and the heat dissipating member. In the present liquid cooling system, the components thereof, i.e., the mounting base, the heat dissipating member and the pump, are combined together to form an integrated structure without utilizing any connecting pipes or fittings.

Other advantages and novel features of the present invention will become more apparent from the following detailed description of preferred embodiment when taken in conjunction with the accompanying drawings, in which:

DETAILED DESCRIPTION

Figure 1:
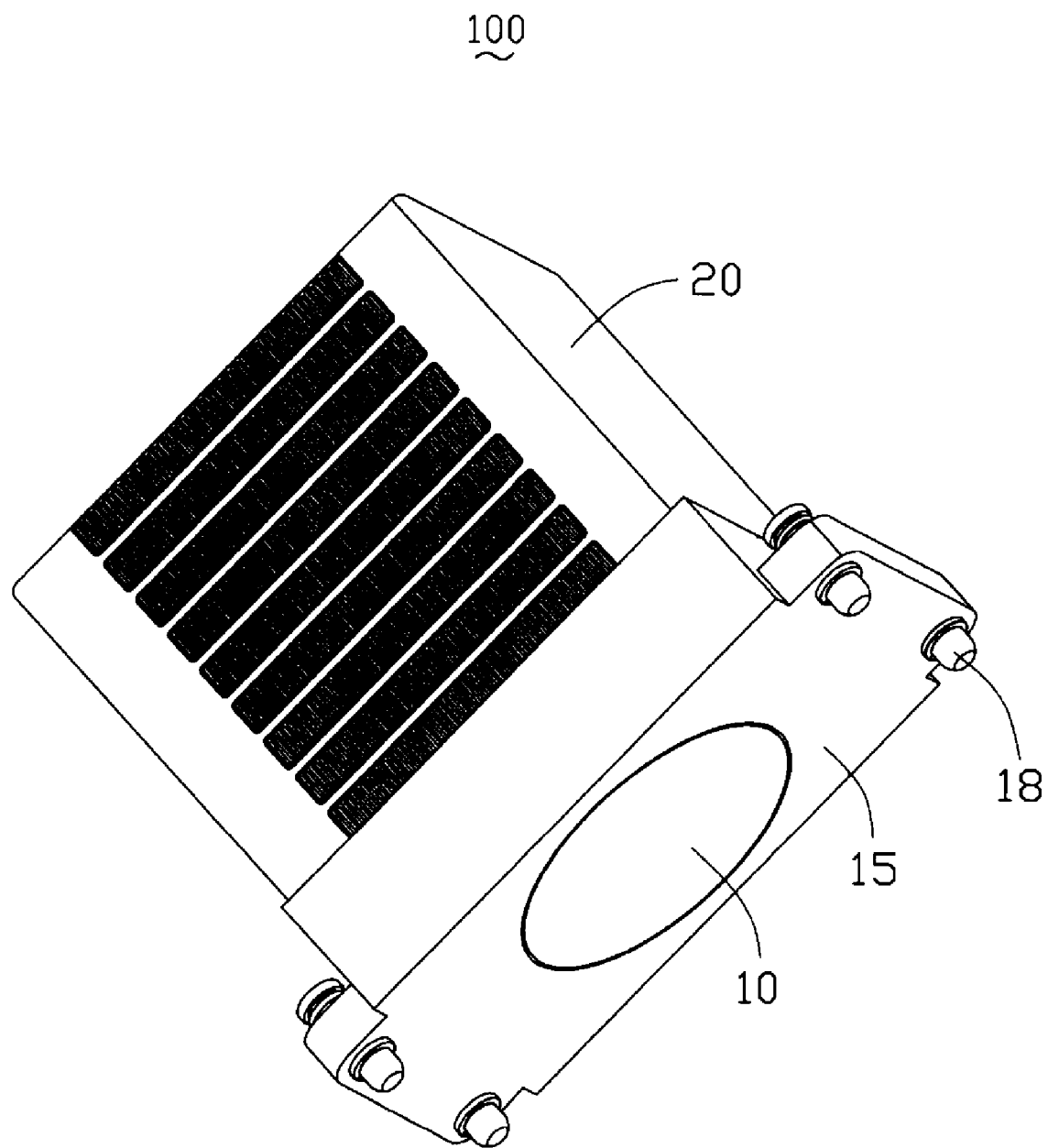
FIG. 1 is an isometric view of a liquid cooling system in accordance with one embodiment of the present invention.
Figure 2:
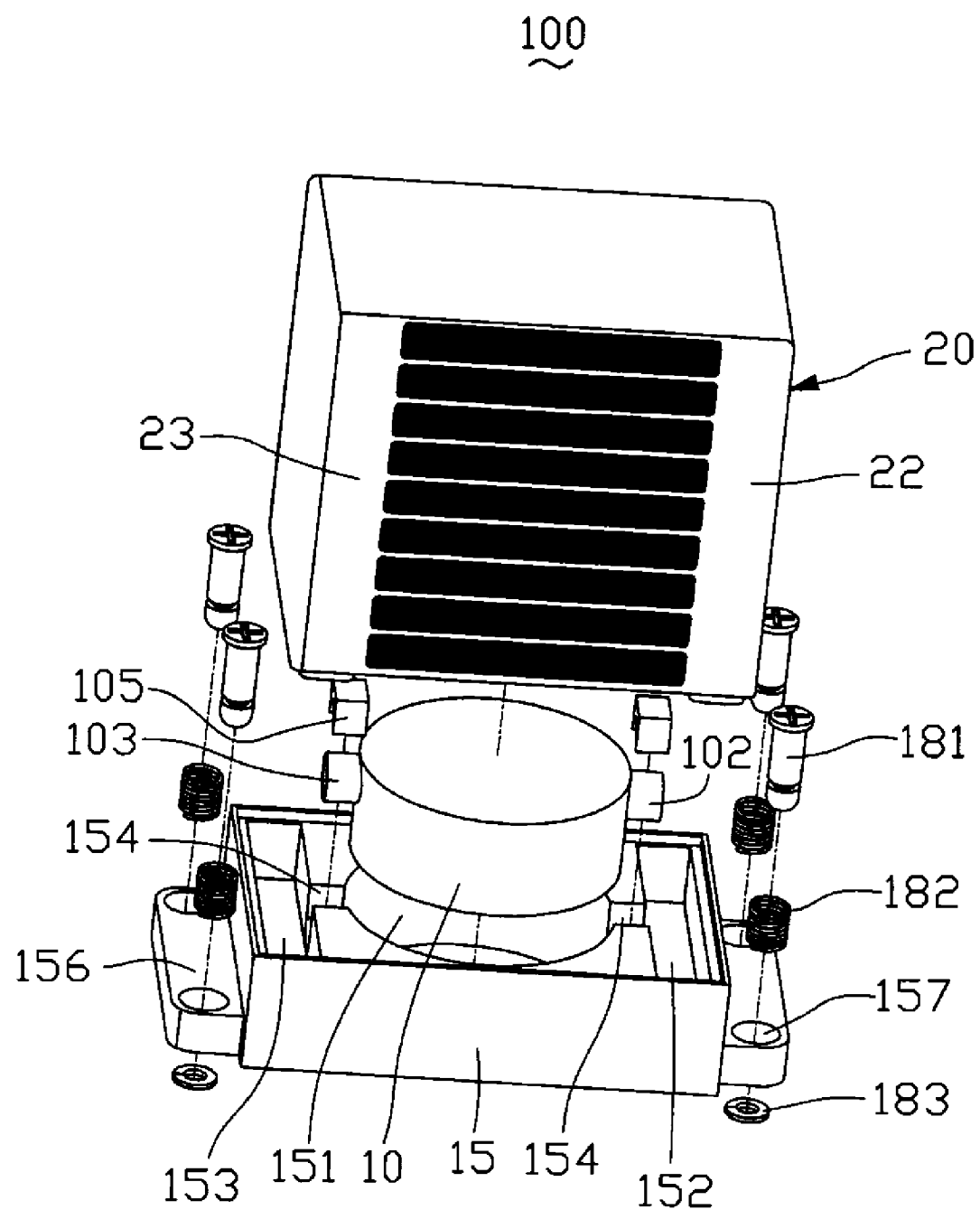
FIG. 2 is an exploded, isometric view of the liquid cooling system of FIG. 1.
Figure 3:
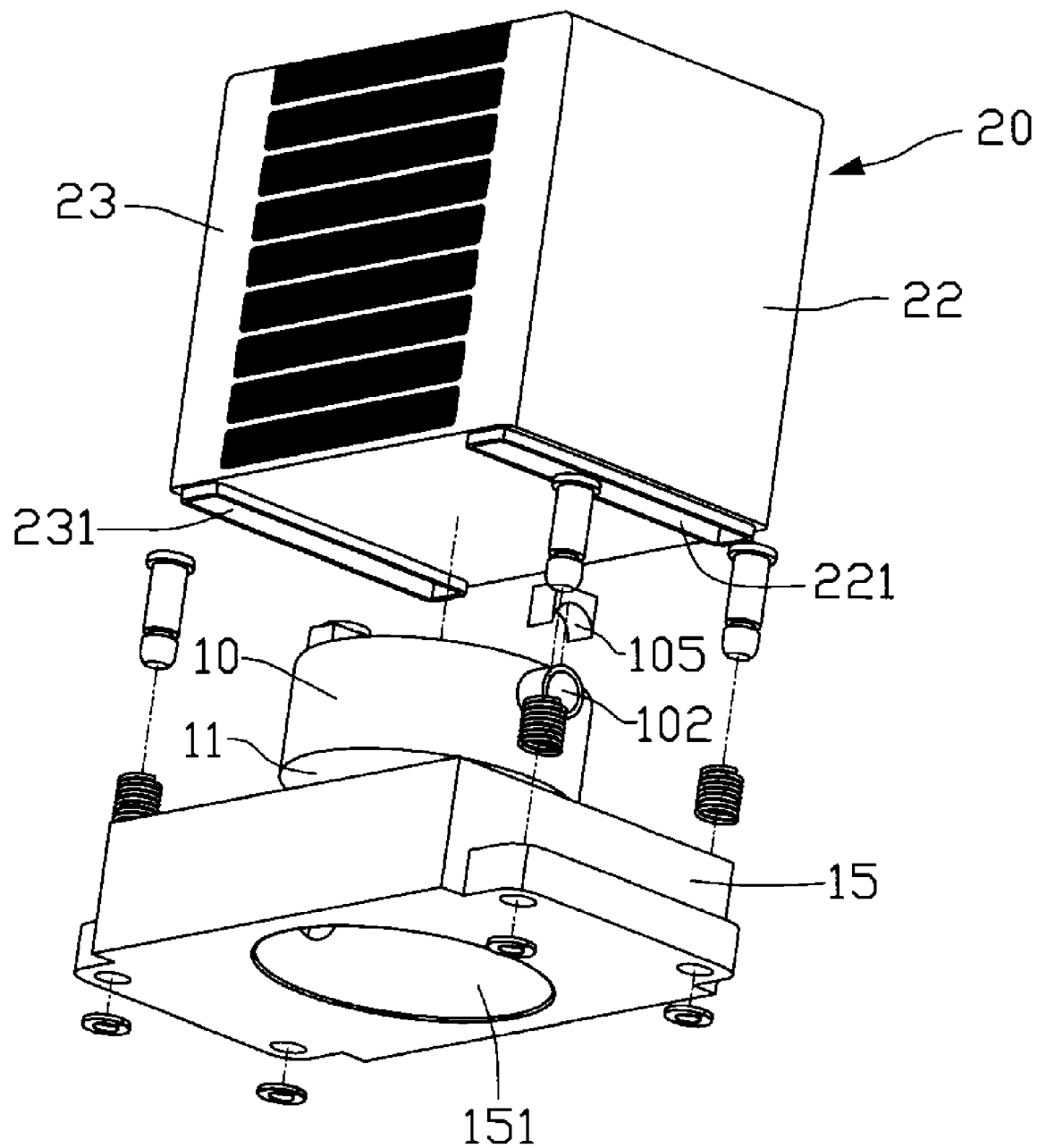
FIG. 3 is similar to FIG. 2, but viewed from another aspect.

FIGS. 1-3 illustrate a liquid cooling system 100 in accordance with one embodiment of the present invention. The liquid cooling system 100 has an integrated structure, which includes a pump 10, a mounting base 15, and a heat dissipating member 20. The heat dissipating member 20 is supportively mounted on the mounting base 15.

The pump 10 has a bottom plate 11, as shown in FIG. 3. The bottom plate 11 operates as a heat absorbing plate to thermally contact a heat generating component (not shown) such as a central processing unit (CPU) of a computer. The bottom plate 11 is made of highly thermally conductive material such as copper or aluminum, and typically, it is integrally formed with remaining parts of the pump 10.

The mounting base 15 defines a through hole 151 at a central portion thereof for receiving the pump 10 therein. The mounting base 15 further defines a pair of recesses, i.e., first recess 152 and second recess 153, at two opposite sides thereof. Thus, the first and second recesses 152, 153 are located at two opposite sides of the through hole 151, respectively. The first and second recesses 152, 153 are maintained in fluid communication with the pump 10. Specifically, the pump 10 has an inlet 102 and an outlet 103 at opposite sides thereof, respectively. After the pump 10 is received in the through hole 151 of the mounting base 15, the inlet 102 and outlet 103 thereof are respectively and fixedly captured in a pair of cutouts 154 defined in the mounting base 15. Meanwhile, a pair of sealing gaskets 105 is utilized to further fixedly maintain the inlet 102 and outlet 103 in the cutouts 154 and to seal the through hole 151 from the first and second recesses 152, 153. Each sealing gasket 105 has a generally inverted U-shaped configuration with a lower recess (not labeled and better seen in FIG. 3) for fittingly receiving the inlet 102 or outlet 103 therein. Thus, the inlet 102 and outlet 103 of the pump 10 are fluidically connected with the first and second recesses 152, 153, respectively.

The mounting base 15 further has a pair of flanges 156 extending outwardly from the longitudinal sides thereof, respectively. Each flange 156 defines therein a pair of mounting holes 157 each for receiving a fastener 18 used for securing the liquid cooling system 100 to the computer in which the CPU is mounted. The fastener 18 includes a pin 181, a spring 182 and a washer 183. In order to lower down the total manufacturing cost for the mounting base 15, the mounting base 15 is preferably made of plastic material by methods such as injection molding.

Figure 4:
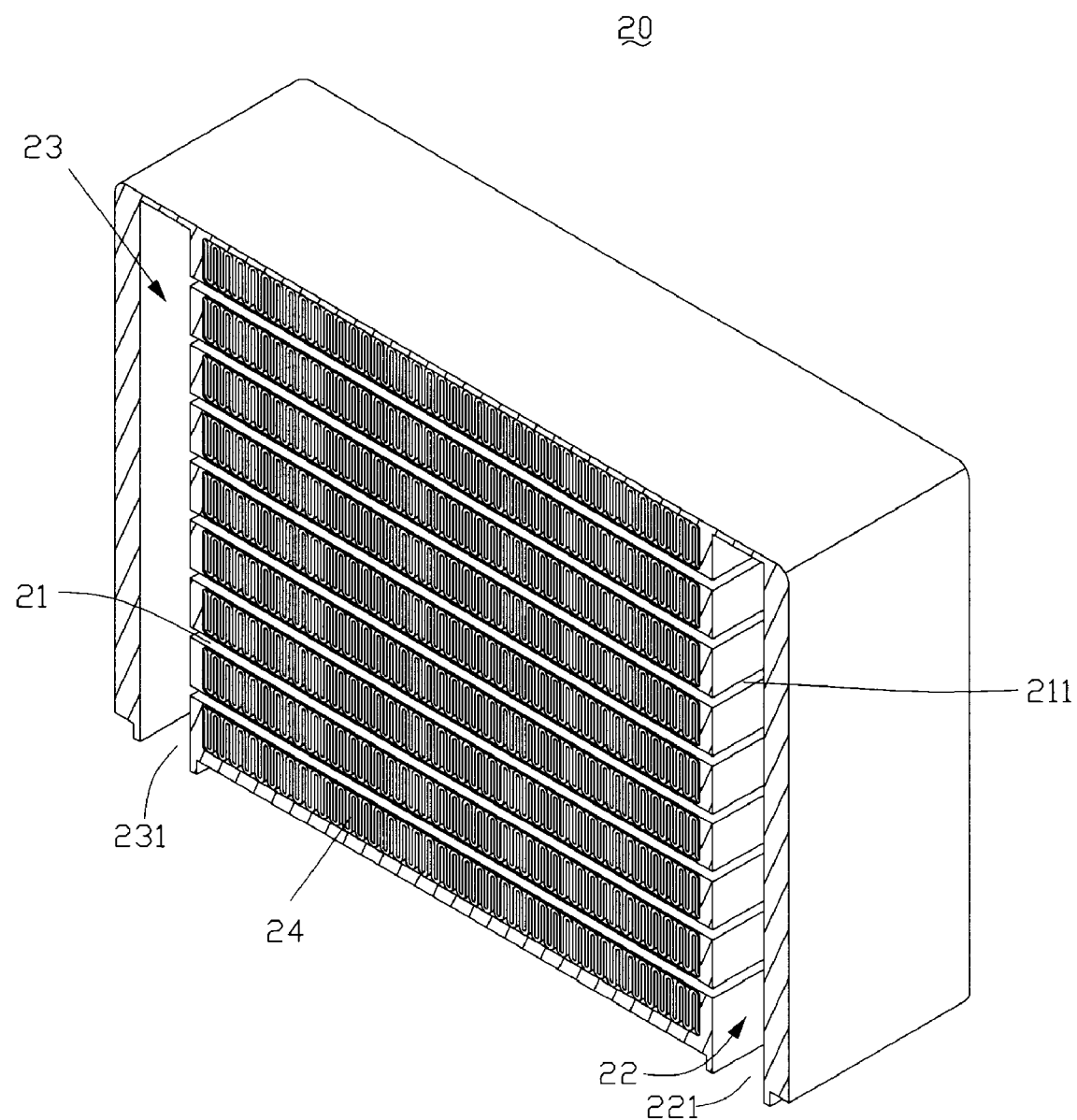
FIG. 4 is a sectioned isometric view of a heat dissipating member of the liquid cooling system of FIG. 1.

With reference to FIGS. 2-4, the heat dissipating member 20 includes a plurality of connecting conduits 21 disposed in parallel with each other and first, second fluid reserve housings 22, 23 located at respective opposite sides of these connecting conduits 21, and a fin member 24 sandwiched between every adjacent two connecting conduits 21. The fin member 24 is maintained in thermal contact with the corresponding connecting conduits 21. Each of the connecting conduits 21 defines therein a fluid passage 211, which is fluidically connected with the first and second fluid reserve housings 22, 23. The first and second fluid reserve housings 22, 23 are used to reserve a predetermined quantity of the coolant in the liquid cooling system 100 and operate to allocate the coolant reserved therein evenly over the fluid passages 211 of the connecting conduits 21. The first fluid reserve housing 22 has an opening 221 at a bottom thereof. The opening 221 has a size substantially the same as that of the first recess 152 of the mounting base 15. Similarly, the second fluid reserve housing 23 has an opening 231 at a bottom thereof and the opening 231 has a size substantially the same as that of the second recess 153 of the mounting base 15. In particular, the openings 221, 231 are so dimensioned that, when the heat dissipating member 20 is mounted to the mounting base 15, the first and second fluid reserve housings 22, 23 are hermetically connected with the first and second recesses 121, 122 of the mounting base 15, respectively. That is, the heat dissipating member 20 is mounted to the mounting base 15 in a press-fit manner. Alternatively, gaskets or similar devices may be used during assembly of the heat dissipating member 20 to the mounting base 15 in order to maintain a good sealing effect.

After the heat dissipating member 20 is assembled to the mounting base 15, the components (i.e., the pump 10, the mounting base 15 and the heat dissipating member 20) of the liquid cooling system 100 are fluidically connected together to form a heat transfer loop inside the liquid cooling system 100. In operation, the bottom plate 11 of the pump 10 is maintained in thermal contact with the CPU of the computer to which the liquid cooling system 100 is applied. As passing through the pump 10, the coolant receives the heat generated by the CPU. Under the driving of the pump 10, the coolant flows towards the heat dissipating member 20 where the heat of the coolant is released to ambient environment. Specifically, the coolant in the liquid cooling system 100 is firstly guided to the second recess 153 and accordingly the second fluid reserve housing 23. The second fluid reserve housing 153 then allocates the coolant evenly to the fluid passages 211 of the connecting conduits 21. As the coolant flows through the fluid passages 211, the heat of the coolant is released to the fin members 24 of the heat dissipating member 20. The coolant so cooled down then enters into and accumulates in the first fluid reserve housing 22 and the first recess 152. Thereafter, the coolant is drawn from the first recess 152 back to the pump 10 for being available again for heat absorption from the CPU, whereby the heat of the CPU is continuously removed away as the coolant is circulated continuously along the heat transfer loop of the liquid cooling system 100.

In the present liquid cooling system 100, the pump 10, the mounting base 15 and the heat dissipating member 20 are fluidically connected together without utilizing any connecting pipes or fittings. Therefore, the components of the liquid cooling system 100 can be assembled easily to form an integrated and compact structure, as shown in FIG. 1. Since no connecting pipes or fittings are required in the present liquid cooling system 100, the liquid leakage problem associated with the pipe connections in the prior art is also eliminated. Furthermore, by addressing a limited number of the fasteners 18, the liquid cooling system 100 as a whole can be easily mounted to the computer in which the CPU is installed for removing heat from the CPU, and demounted from the computer when the liquid cooling system 100 needs repair or maintenance.

Figure 5:
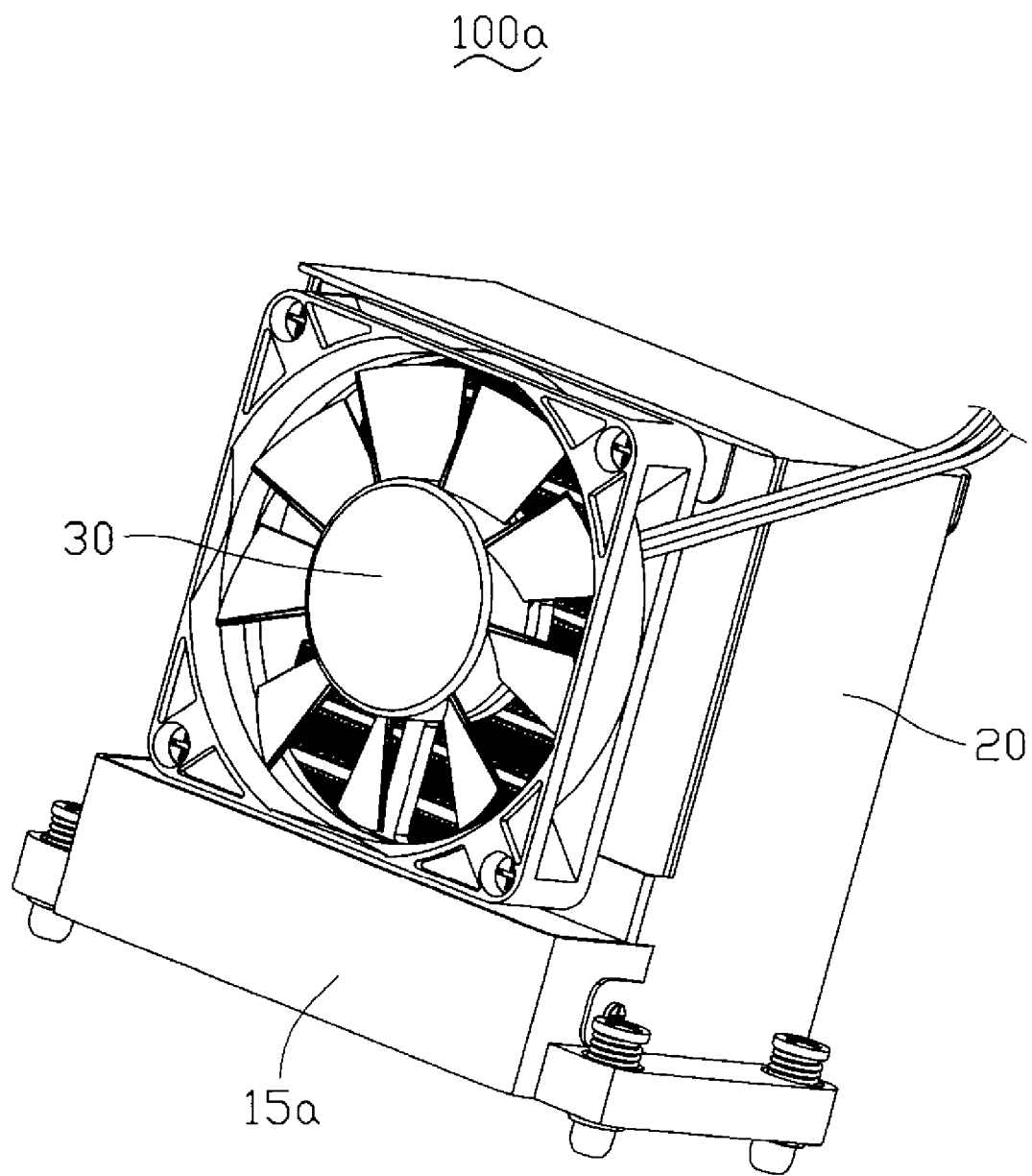
FIG. 5 is an isometric view of a liquid cooling system in accordance with an alternative embodiment of the present invention.

FIG. 5 shown a liquid cooling system 100a in accordance with an alternative embodiment of the present invention. In this embodiment, the mounting base 15a is dimensioned to have a larger footprint than that of the heat dissipating member 20 so that an electric fan 30 can also be supportively mounted on the mounting base 15a. The electric fan 30 is fixedly secured to the heat dissipating member 20 for producing an airflow towards the same. The other structures of this embodiment are the same as that of the first embodiment as shown in FIGS. 1-4, and descriptions thereof are omitted.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A liquid cooling system for removing heat from a heat generating component, comprising:
    a mounting base defining therein a through hole;
    a heat dissipating member supportively mounted to and being in fluid communication with the mounting base; and
    a pump received in the through hole of the mounting base, the pump having a bottom plate adapted for thermally contacting the heat generating component, the pump being configured for driving a coolant to circulate through the mounting base and the heat dissipating member.

2. The liquid cooling system of claim 1, wherein the heat dissipating member includes at least one housing member in which the coolant is reserved, at least one conduit communicating with the housing member, and a fin member maintained in thermal contact with the conduit.

3. The liquid cooling system of claim 1, wherein the heat dissipating member is mounted to the mounting base in a press-fit manner.

4. The liquid cooling system of claim 1, wherein the bottom plate of the pump is made of metal material and the mounting base is made of non-metal material.

5. The liquid cooling system of claim 1, wherein the bottom plate of the pump is integrally formed with remaining parts of the pump.

6. A liquid cooling system comprising:
- a mounting base;
- a heat dissipating member mounted to the mounting base, the heat dissipating member including first and second housing members arranged separately and a plurality of conduits fluidically connected between the first and second housing members; and
- a pump received in the mounting base and maintained in fluid communication with said first and second housing members, the pump being configured for driving a coolant to circulate through said first and second housing members and said conduits;
- wherein the heat dissipating member is located above the mounting base; and
- wherein the heat dissipating member is mounted to the mounting base in a press-fit manner.

7. The liquid cooling system of claim 6, wherein the mounting base defines therein a through hole for receiving the pump therein and the pump has a bottom plate made of metal and adapted for thermally contacting a heat generating component.

8. The liquid cooling system of claim 7, wherein the mounting base further defines therein first and second recesses, the first and second recesses being fluidically connected with said first and second housing members, respectively.

9. The liquid cooling system of claim 8, wherein the first and second recesses are located at opposite sides of the mounting base, respectively, and the pump is fluidically connected with the first and second recesses.

10. The liquid cooling system of claim 6, wherein a fin member is sandwiched between at least two adjacent conduits.

11. The liquid cooling system of claim 6, wherein the mounting base is made of non-metal material.

* * * * *